United States Patent
Pan et al.

(10) Patent No.: US 6,830,998 B1
(45) Date of Patent: Dec. 14, 2004

(54) GATE DIELECTRIC QUALITY FOR REPLACEMENT METAL GATE TRANSISTORS

(75) Inventors: James Pan, Fishkill, NY (US); Paul Besser, Sunnyvale, CA (US); Christy Mei-Chu Woo, Cupertino, CA (US); Minh Van Ngo, Fremont, CA (US); Jinsong Yin, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/462,667

(22) Filed: Jun. 17, 2003

(51) Int. Cl.$^7$ .......................................... H01L 21/3205
(52) U.S. Cl. .................... 438/592; 926/229; 926/299
(58) Field of Search ........................... 438/229, 299, 438/926, 585, 592

(56) References Cited

U.S. PATENT DOCUMENTS

| | | | | |
|---|---|---|---|---|
| 6,074,921 A | * | 6/2000 | Lin | 438/299 |
| 6,358,866 B1 | * | 3/2002 | Stesmans et al. | 438/770 |
| 6,468,926 B1 | * | 10/2002 | Irino et al. | 438/773 |
| 6,610,614 B2 | * | 8/2003 | Niimi et al. | 438/775 |
| 6,660,588 B1 | * | 12/2003 | Yang et al. | 438/257 |

* cited by examiner

*Primary Examiner*—Michael Trinh
*Assistant Examiner*—Christy Novacek

(57) ABSTRACT

Gate dielectric degradation due to plasma damage during replacement metal gate processing is cured and prevented from further plasma degradation by treatment of the gate dielectric after removing the polysilicon gate. Embodiments include low temperature vacuum annealing after metal deposition and CMP, annealing in oxygen and argon, ozone or a forming gas before metal deposition, or heat soaking in silane or disilane, before metal deposition.

9 Claims, 8 Drawing Sheets

GATE DIELECTRIC QUALITY FOR REPLACEMENT METAL GATE TRANSISTORS

TECHNICAL FIELD

The present invention relates to semiconductor devices comprising transistors with metal gate electrodes and improved gate dielectric layers. The present invention is particularly applicable in fabricaturing high speed semiconductor devices having submicron design features.

BACKGROUND ART

The integration of hundreds of millions of circuit elements, such as transistors, on a single integrated circuit necessitates further dramatic scaling down or microminiaturization of the physical dimensions of circuit elements, including interconnection structures. Microminiaturization has engendered a dramatic increase in transistor engineering complexity, such as the inclusion of graded well-doping, epitaxial wafers, halo implants, tip implants, lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

Recently, metal gate electrodes have evolved for improving the drive current by reducing polysilicon depletion, and reducing processing temperatures subsequent to metal gate formation. In order to implement replacement metal gate process flow, a dummy gate, such as polysilicon, is removed by dry/wet etching, followed by metal deposition.

Polysilicon dry etching is conventionally performed using a plasma. Metal deposition is conventionally performed using physical vapor deposition or sputtering, which also requires a plasma. However, the use of a plasma causes radiation damage to the gate oxide thereby adversely impacting transistor performance.

Accordingly, a need exists for methodology enabling the fabrication of micro-miniaturized semiconductor devices comprising transistors with metal gate electrodes having improved a gate dielectric quality.

DISCLOSURE OF THE INVENTION

An advantage of the present invention is a semiconductor device having a transistor with a metal gate electrode and a gate oxide with improved quality.

Another advantage of the present invention is a method of manufacturing a semiconductor device comprising a transistor with a metal gate electrode and a gate oxide of improved quality.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming a removable gate over a substrate with a gate dielectric layer therebetween; forming a dielectric layer over the substrate and exposing an upper surface of the removable gate; removing the removable gate leaving an opening in the dielectric layer exposing an upper surface of the gate dielectric layer, wherein the gate dielectric layer is damaged when removing the removable gate; depositing a conductive layer filling the opening and forming an overburden on the dielectric layer; and conducting chemical mechanical polishing (CMP); the method further comprising treating the gate dielectric layer to remedy the damage to the gate dielectric layer.

Embodiments of the present invention include forming a removable polysilicon gate over a gate oxide layer and treating the gate oxide layer at an elevated temperature. Embodiments of the present invention include annealing the gate oxide layer by vacuum annealing after chemical mechanical polishing. Embodiments of the present invention also include annealing after removing the removable gate and wet cleaning before depositing the conductive layer. Annealing before depositing the conductive layer may be conducted in oxygen and argon, ozone, or a forming gas, or by heat soaking in an atmosphere containing silicon, such as heat soaking in silane or disilane. Embodiments of the present invention also comprise forming a composite metal gate electrode comprising a tantalum silicon nitride liner and tantalum nitride filling the opening.

Another advantage of the present invention is a semiconductor device comprising: a substrate; a gate oxide layer on the substrate; a layer of silicon on the gate oxide layer; and a metal gate electrode on the layer of silicon.

A further aspect of the present invention is a semiconductor device having complimentary metal oxide (CMOS) devices including an NMOS transistor with a metal gate electrode and a PMOS transistor with a doped polysilicon gate electrode.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modification in various obvious respects, all without departing from the present invention. Accordingly, the drawings and description are to be regarded as illustrative in nature, and not as restrictive.

DESCRIPTION OF THE INVENTION

Figure 1:
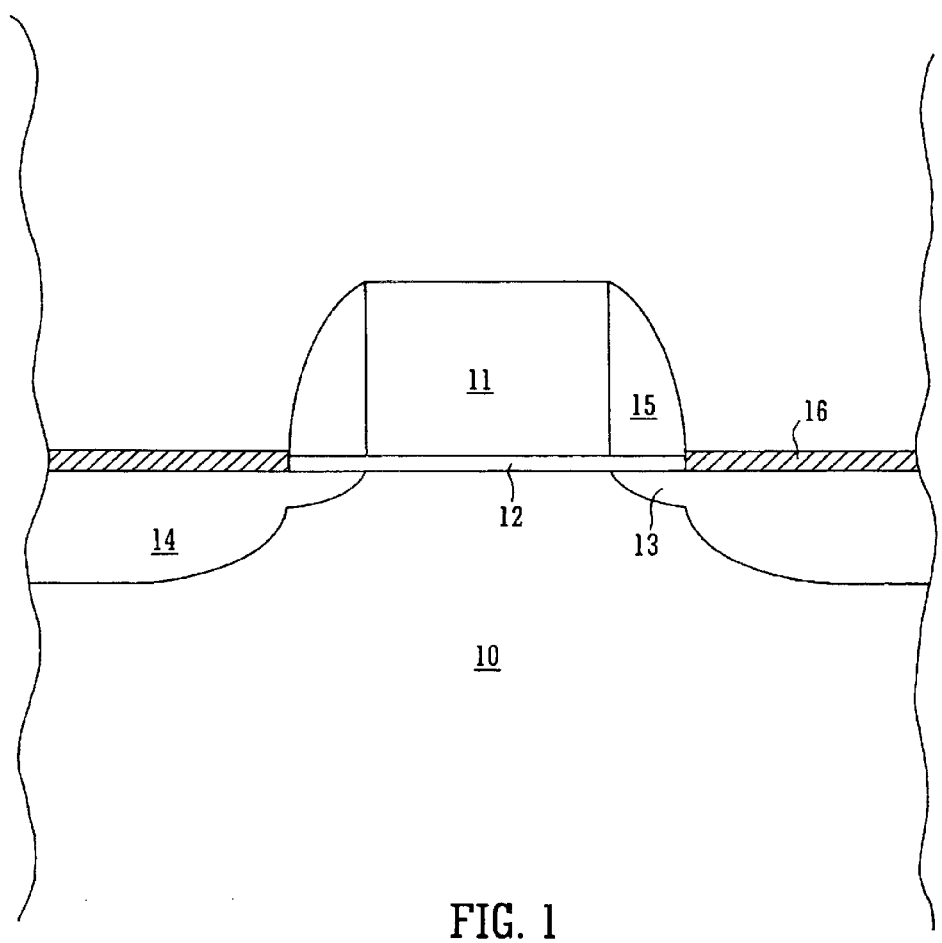
FIGS. 1 through 6 schematically illustrate sequential phases of a method in accordance with an embodiment of the present invention, wherein similar features are denoted by similar reference characters.

The present invention address and solves the problem of gate dielectric degradation attendant upon conventional replacement metal gate processing to replace high resistivity polysilicon gate electrodes. During such conventional replacement metal gate processing, the underlying gate dielectric layer, e.g., gate oxide layer, suffers degradation due to radiation damage during plasma processing, as by dry etching to remove the dummy polysilicon gate and/or during subsequent metal deposition in a plasma. The present invention addresses and solves such gate dielectric degradation during replacement metal gate fabrication by treating the damaged gate dielectric layer to not only cure the damage caused by plasma processing but also to protect the cured gate dielectric layer against future damage during plasma processing.

In accordance with embodiments of the present invention, low temperature vacuum annealing is conducted subsequent to CMP, which is conducted subsequent to metal deposition. Such low temperature annealing may be conducted at a temperature of 300° C. to 600° C., e.g., 600° C., at a pressure of 0.001 mTorr to 1 mTorr, for about 1 to about 10 minutes.

In accordance with another embodiment of the present invention, annealing is conducted after wet cleaning, which is conducted subsequent to removal of the dummy polysilicon by dry etching, and prior to metal deposition. In accordance with this embodiment of the present invention, annealing may be implemented at a relatively low temperature, such as 400° C. to 800° C., in an atmosphere of oxygen and argon, an atmosphere of ozone, an atmosphere comprising a forming gas, typically containing 4 vol % hydrogen and 96 vol % nitrogen, or by heat soaking in an atmosphere of silicon, as by heat soaking in silane or disilane. Embodiments include annealing in oxygen at flow rate of 50 to 100 sccm and argon at a flow rate of 50 to 100 sccm. Such annealing can also be conducted in a silicon-containing environment. Such annealing may be conducted for 0.1 to 2 minutes.

In accordance with embodiments of the present invention, the intermediate structure after removing the polysilicon dummy gate and wet cleaning is heat soaked in silane or disilane. Advantageously, as a result of such heat treatment, a thin layer of silicon is formed on the gate dielectric layer, as any thickness of 5 Å to 20 Å. The presence of silicon at the metal/gate oxide interface reduces the interface trapped density, as to about $6.4 \times 10^{10}$ $cm^{-2}eV^{-1}$, which is comparable to the most advanced polysilicon MOSFET.

Embodiments of the present invention including forming the metal gate as a composite of plural metal layers. For example, the metal gate can be formed by depositing an initial layer of tantalum silicon nitride, as at a thickness of 20 Å to 100 Å, lining the opening, and then depositing a layer of tantalum nitride forming an overburden which is subsequently removed by CMP.

In another embodiment of the present invention, complimentary metal oxide semiconductor (CMOS) transistors are formed wherein only the N-channel MOSFET contains a replacement metal gate electrode, while the P-channel MOSFET contains a conventional dope-polysilicon gate electrode. This objective can be achieved by covering the P-channel MOSFET with a photoresist mask and then implementing the metal gate process flow on the N-channel MOSFET. In accordance with an embodiment of the present invention, replacement metal gate electrode processing is implemented by forming the metal gate electrode after all high temperature cycles are complete, such as source/drain activation annealing.

An embodiment of the present invention is schematically illustrated in FIGS. 1 through 6. Adverting to FIG. 1, a temporary replaceable or dummy gate 11, such as polysilicon, is formed over substrate 10 with a gate dielectric layer 12 therebetween, such as silicon oxide. Embodiments of the present invention also include depositing a high dielectric constant material for the gate dielectric layer 12, such as $ZrO_2$, $HfO_2$, $InO_2$, $LaO_2$ and $TaO_2$. Shallow source/drain extensions of 14 are formed, dielectric sidewall spacers 15, such as silicon oxide, silicon nitride or silicon oxynitride, are then formed on the removable gate 11. Ion implantation is then conducted to form deep source/drain regions 13, followed by silicidation to form metal silicide layer 16 on the exposed surfaces of the source/drain regions 13, such as nickel silicide. The manipulative steps illustrated in FIG. 1 are implemented in a conventional manner.

Figure 2:
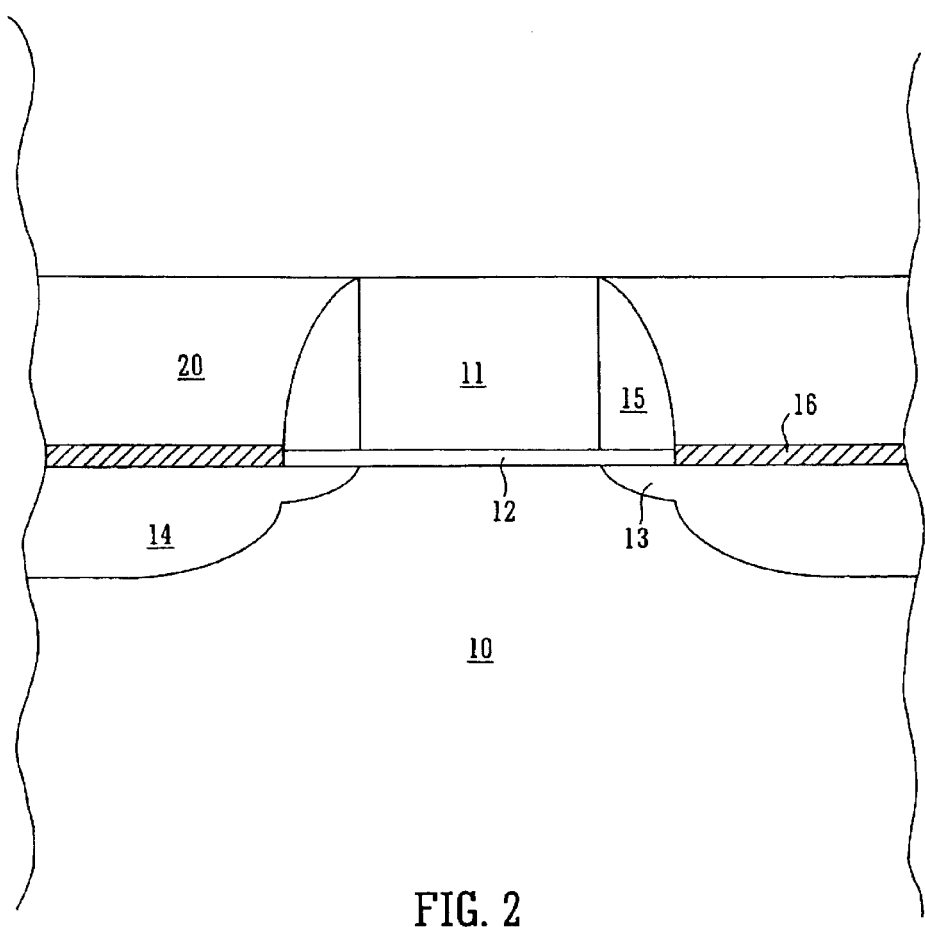

Adverting to FIG. 2, a layer of dielectric material, such as silicon oxide, e.g., silicon oxide formed from tetraethyl orthosilicate (TEOS), is deposited followed by CMP forming layer 20. It should be understood that shallow source/drain extensions 13 and source/drain regions 14 are activated by high temperature thermal annealing, such as at a temperature of about 900° C. and above, at the stage illustrated in FIG. 1 or alternatively, FIG. 2 or alternatively, even at the stage illustrated in FIG. 3 prior to depositing the replacement metal gate electrode.

Figure 3:
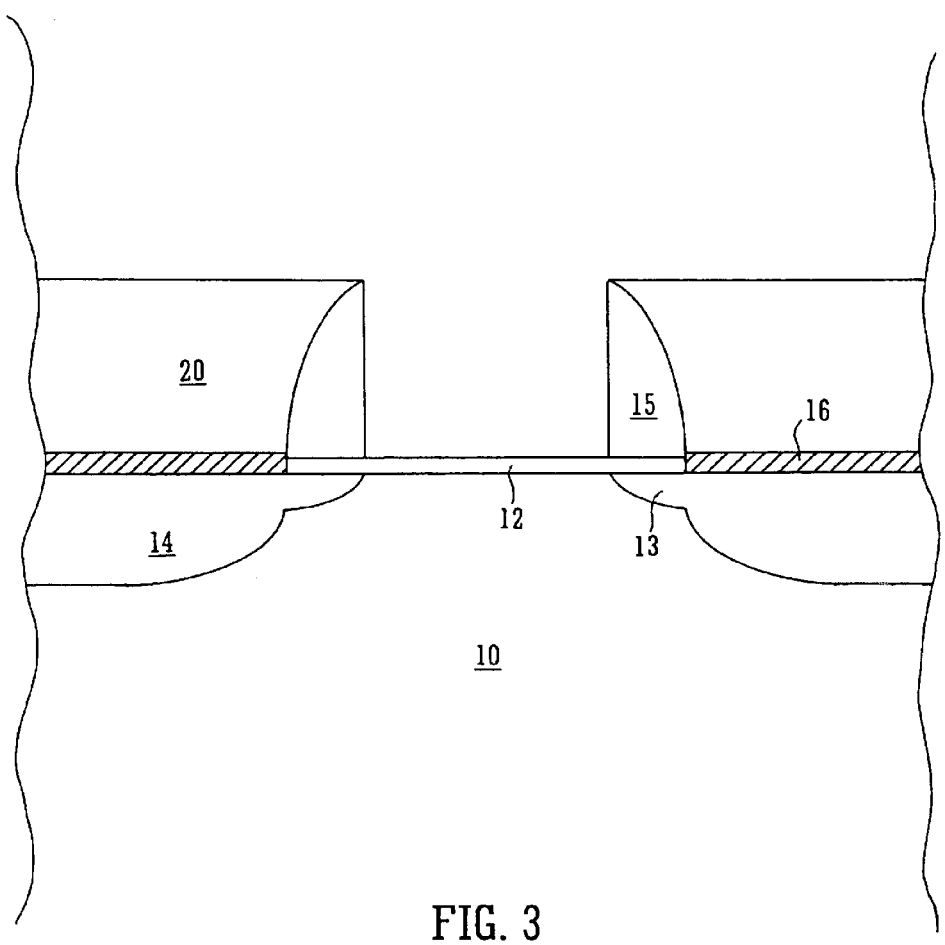

As illustrated in FIG. 3, replacement or dummy gate 11 is removed, as by dry etching. During such dry etching to remove dummy gate 11, the underlying gate oxide layer is damaged by radiation due to the plasma employed or generated during dry etching. Radiation damage to the underlying gate oxide layer can also occur during subsequent metal deposition in a plasma. In accordance with embodiments of the present invention, the gate oxide layer may be treated at this point in the process by annealing, as at a temperature of 400° C. to 800° C., in various atmospheres, such as an atmosphere of oxygen and argon, a forming gas or ozone, or by heat soaking in silane or disilane. Heat soaking in silane or disilane results in the formation of a thin layer of silicon on the gate oxide layer, as at a thickness of 5 Å to 10 Å, thereby advantageously reducing interface trap density.

Figure 4:
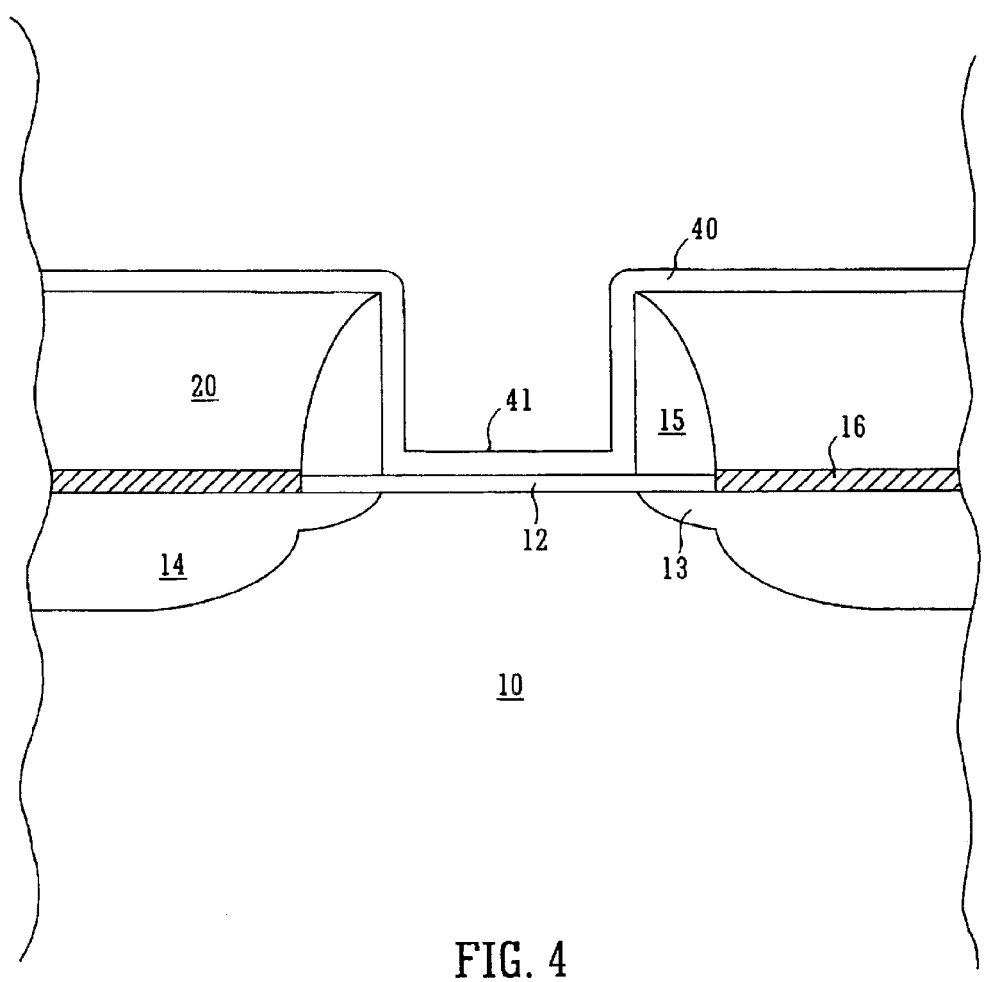
Figure 5:
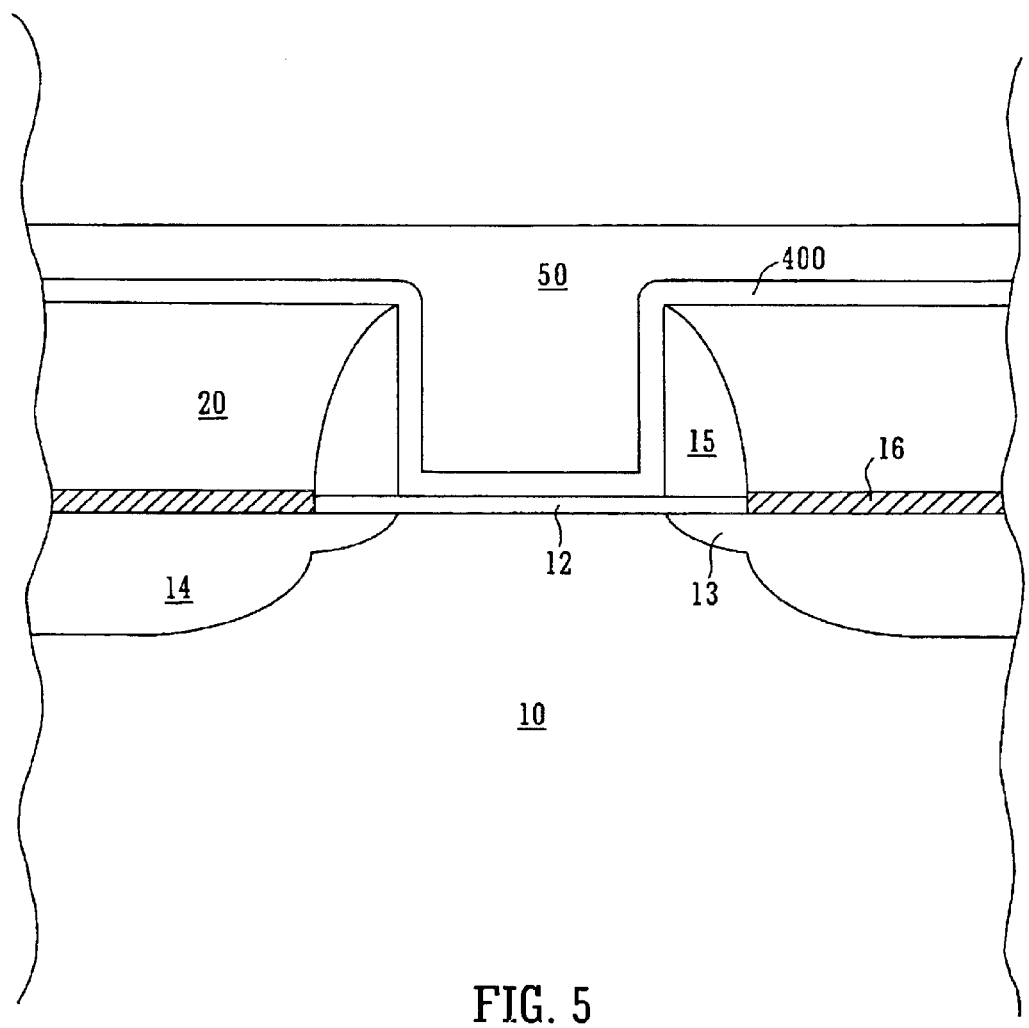

Subsequently, a layer of tantalum silicon nitride 40 is deposited, as illustrated in FIG. 4, as at a thickness of 20 to 100 Å, as by physical vapor deposition. A layer of conductive material 50, such as tantalum nitride is then deposited, as shown in FIG. 5. The present invention is not limited to a conductive material of 50 of tantalum nitride. Other suitable materials can be employed, such as copper (Cu) or a Cu alloy containing minor amounts of tantalum, indium, tin, zinc, manganese, titanium, magnesium, chromium, germanium, strontium, platinum, aluminum or zirconium. Other suitable metals include nickel, ruthenium, cobalt, molybdenum and alloys thereof. The overburden is then removed during planarization by CMP, resulting in the structure illustrated in FIG. 6 containing replacement metal gate electrode in the form of a composite comprising tantalum silicon nitride 400 and tantalum nitride 60.

Figure 6:
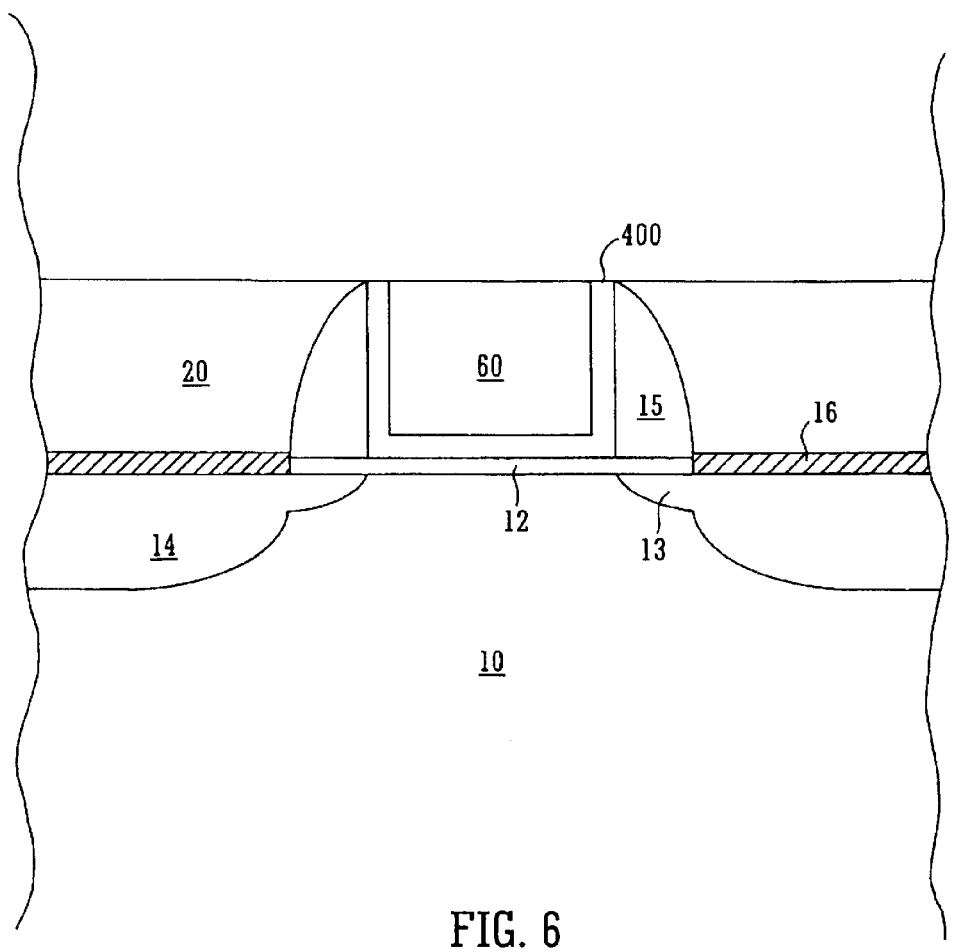

In another embodiment of the present invention, a low temperature vacuum annealing is conducted subsequent to CMP on the structure shown in FIG. 6. Such low temperature vacuum annealing may be implemented in addition to or in lieu of the low temperature annealing prior to metal deposition.

Figure 7A:
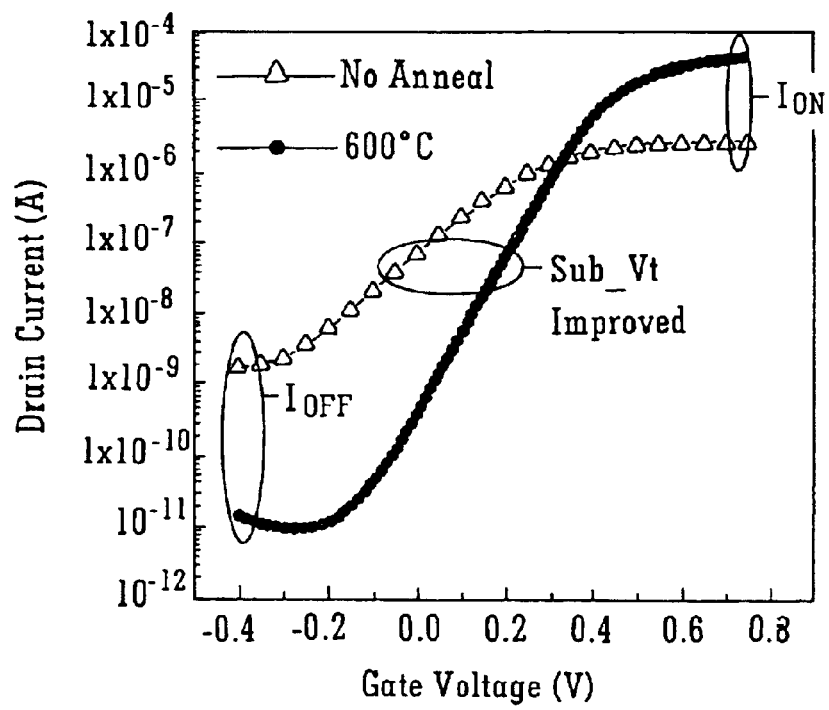
FIGS. 7a and 7b are plots of data showing a reduction in gate leakage current and defect density achieved by an embodiment of the present invention.
Figure 7B:
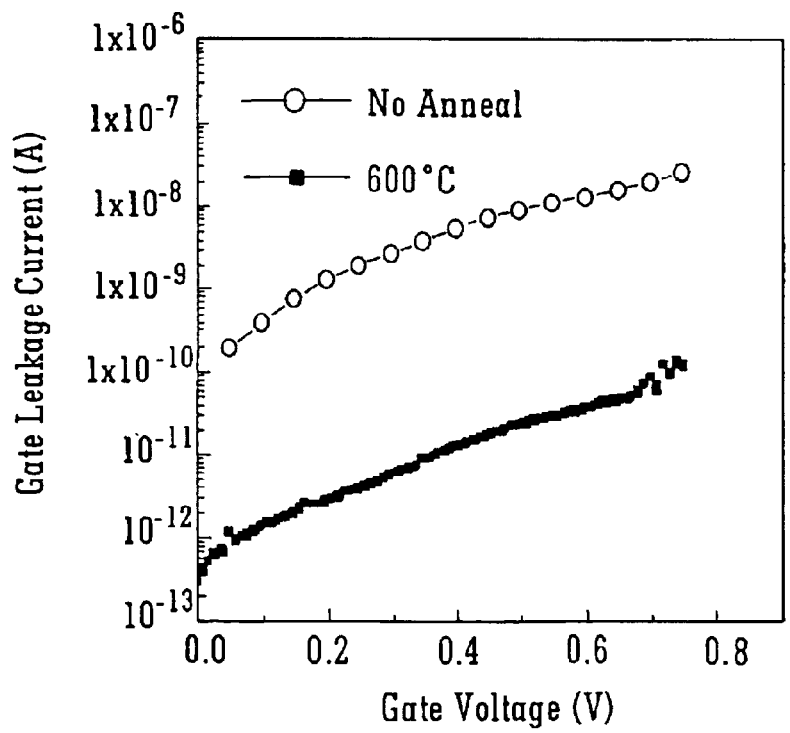

Comparison testing was conducted with and without such annealing at a temperature of 600° C. and the results reported in FIGS. 7A and 7B. It should be apparent that a low temperature vacuum annealing conducted after CMP in accordance with an embodiment of the present invention reduces the gate leakage current and defect density at the gate oxide/silicon interface. The data were measured from a ALCDD TaN/PVD and Electrode-Plated Cu stacked replacement metal gate and NMOSFET. The on current (Ion), off current (Ioff), subthreshhold slope (SUB_Vt) and gate leakage current (IG) are all significantly improved.

Figure 8:
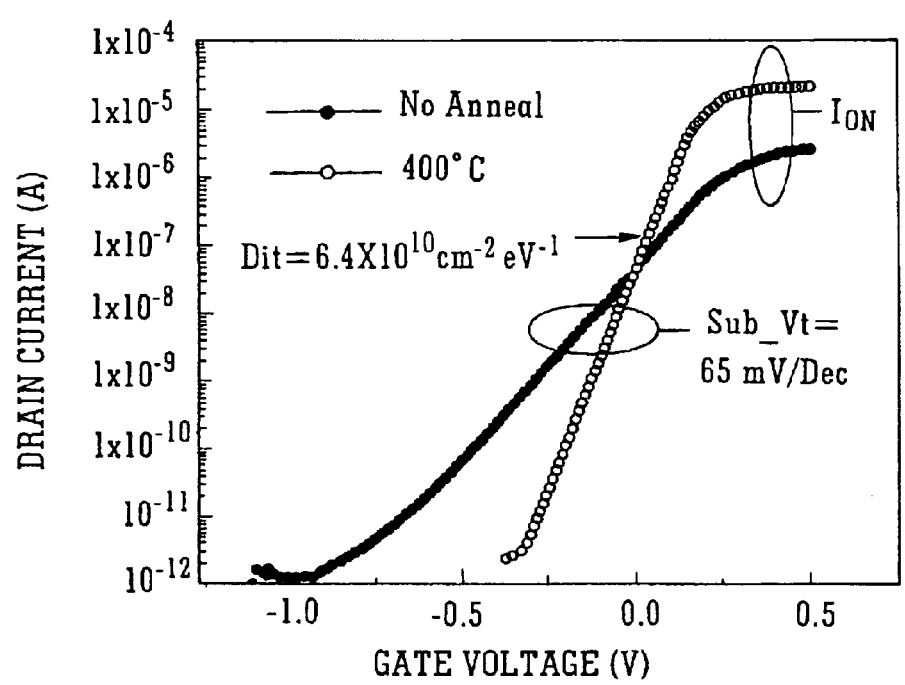
FIG. 8 is a plot of data showing a reduction in leakage current achieved by another embodiment of the present invention.

Further experimental testing was conducted to demonstrate the reduction in leakage current attendant upon gate oxide treatment by heat soaking in silane or disilane. The Ids vs. Vgs plot shown in FIG. 8 demonstrates an advantageous reduction in leakage current. The data generated in FIG. 8 were measured from a TaSiN/Ta 8 replacement metal gate NMOSFET. The presence of silicon at the metal gate/gate oxide interface reduces the Dit (interface trapped density) to $6.4 \times 10^{10}$ $cm^{-2}eV^{-1}$, which is comparable to the best polysilicon MOSFET currently available.

The present invention provides methodology enabling the fabrication of semiconductor devices having transistors with replacement metal gate electrodes and gate dielectric layers with improved integrity. The present invention enables cures radiation damaged gate oxide layers and prevents subsequent damage during plasma processing.

The present invention enjoys industrial applicability in the fabrication of various types of semiconductor devices. The present invention is particularly applicable in fabricating semiconductor devices having submicron features and exhibiting a high drive current and minimized leakage current.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present application. It is to be understood that the present invention is capable of use in various other combinations and environments, and is capable of changes or modifications within the scope of the inventive concept as expressed herein.

What is claimed is:

1. A method of manufacturing a semiconductor device having a transistor with a metal gate electrode, the method comprising:
    forming a removable gate over a substrate with a gate dielectric layer therebetween;
    forming a dielectric layer over the substrate and exposing an upper surface of the removable gate;
    removing the removable gate leaving an opening in the dielectric layer exposing an upper surface of the gate dielectric layer, wherein the gate dielectric layer is damaged when removing the removable gate;
    thereafter depositing a conductive layer filling the opening and forming an overburden upon the dielectric layer;
    annealing by heat soaking in an atmospheric containing silicon to remedy the damage to the gate dielectric layer; and
    conducting chemical mechanical polishing (CMP).

2. The method according to claim 1, comprising forming the removable gate of polysilicon.

3. The method according to claim 1, wherein the gate dielectric layer comprises a gate oxide layer.

4. The method according to claim 3, comprising treating the gate oxide layer by vacuum annealing after CMP.

5. The method according to claim 3, comprising sequentially:
    removing the removable gate by dry etching;
    wet cleaning;
    annealing; and
    depositing the conductive layer.

6. The method according to claim 5, comprising annealing at a temperature 400° C. to 800° C.

7. The method according to claim 1, comprising heat soaking in silane or disilane.

8. The method according to claim 7, comprising heat soaking at a temperature of 400° C. to 800° C.

9. The method according to claim 1, comprising depositing a conductive layer, comprising a composite of tantalum silicon nitride and tantalum nitride.

* * * * *

UNITED STATES PATENT AND TRADEMARK OFFICE
CERTIFICATE OF CORRECTION

PATENT NO.     : 6,830,998 B1
DATED          : December 14, 2004
INVENTOR(S)    : James Pan et al.

It is certified that error appears in the above-identified patent and that said Letters Patent is hereby corrected as shown below:

<u>Title page,</u>
Item [54], Title, before the word "GATE" insert -- IMPROVED --

Signed and Sealed this

Third Day of May, 2005

JON W. DUDAS
*Director of the United States Patent and Trademark Office*